(12) United States Patent
Peter et al.

(10) Patent No.: US 11,527,865 B2
(45) Date of Patent: Dec. 13, 2022

(54) OPTOELECTRONIC SEMICONDUCTOR COMPONENT

(71) Applicant: OSRAM OLED GmbH, Regensburg (DE)

(72) Inventors: Matthias Peter, Regensburg (DE); Teresa Wurm, Mintraching (DE); Christoph Eichler, Donaustauf (DE)

(73) Assignee: OSRAM OLED GmbH, Regensburg (DE)

( * ) Notice: Subject to any disclaimer, the term of this patent is extended or adjusted under 35 U.S.C. 154(b) by 296 days.

(21) Appl. No.: 16/641,851

(22) PCT Filed: Aug. 10, 2018

(86) PCT No.: PCT/EP2018/071786
§ 371 (c)(1),
(2) Date: Feb. 25, 2020

(87) PCT Pub. No.: WO2019/042746
PCT Pub. Date: Mar. 7, 2019

(65) Prior Publication Data
US 2020/0220325 A1    Jul. 9, 2020

(30) Foreign Application Priority Data
Aug. 30, 2017  (DE) .......................... 102017119931.4

(51) Int. Cl.
*H01S 5/042* (2006.01)
*H01L 31/0304* (2006.01)
(Continued)

(52) U.S. Cl.
CPC ...... *H01S 5/0421* (2013.01); *H01L 31/03048* (2013.01); *H01S 5/3063* (2013.01); *H01S 5/34333* (2013.01); *H01L 33/32* (2013.01)

(58) Field of Classification Search
CPC ..... H01S 5/0425–04253; H01S 5/0421; H01L 31/03048; H01L 33/32–325
See application file for complete search history.

(56) References Cited

U.S. PATENT DOCUMENTS 5,679,965 A * 10/1997 Schetzina .............. B82Y 20/00
257/E29.081
5,740,192 A * 4/1998 Hatano ................ H01S 5/32341
257/101
(Continued)

FOREIGN PATENT DOCUMENTS

CN   103003961 A * 3/2013 ......... H01L 21/0237
CN   103050595 A * 4/2013 ......... H01L 33/0025
(Continued)

OTHER PUBLICATIONS

Akiba, M. et al., "Growth of flat p-GaN contact layer by pulse flow method for high light-extraction AlGaN deep-UV LEDs with Al-based electrode," *Physica Status Solidi*, 9(3-4): pp. 806-809, Feb. 29, 2012.

(Continued)

*Primary Examiner* — Joshua King
(74) *Attorney, Agent, or Firm* — DLA Piper LLP (US)

(57) ABSTRACT

An optoelectronic semiconductor device includes a semiconductor body in which an active layer configured to generate or detect electromagnetic radiation, a first interlayer and a p-conducting contact layer are formed, and a connection layer applied to the semiconductor body, wherein the contact layer is disposed between the first interlayer and the connection layer and adjoins the connection layer, the active layer is arranged on a side of the first interlayer remote from the contact layer, the first interlayer and the contact layer are based on a nitride compound semiconductor, the contact layer is doped with a p-dopant, (Continued)

the contact layer has a thickness of at most 50 nm, and the contact layer includes a lower aluminum content than the first interlayer.

20 Claims, 9 Drawing Sheets

(51) Int. Cl.
*H01S 5/30* (2006.01)
*H01S 5/343* (2006.01)
*H01L 33/32* (2010.01)

(56) References Cited

U.S. PATENT DOCUMENTS

| | | | | |
|---|---|---|---|---|
| 6,072,189 | A * | 6/2000 | Duggan | H01L 33/0025 257/14 |
| 6,204,084 | B1 * | 3/2001 | Sugiura | H01S 5/32341 438/22 |
| 6,515,313 | B1 * | 2/2003 | Ibbetson | H01L 33/32 257/101 |
| 8,294,179 | B1 * | 10/2012 | Raring | H01S 5/34333 257/E33.005 |
| 8,536,615 | B1 * | 9/2013 | Driscoll | H01L 21/02458 257/101 |
| 2002/0081763 | A1 * | 6/2002 | Ishibashi | H01L 21/0265 438/32 |
| 2002/0141468 | A1 * | 10/2002 | Ito | B82Y 20/00 438/22 |
| 2003/0052322 | A1 * | 3/2003 | Yamaguchi | H01L 33/40 257/79 |
| 2003/0118066 | A1 * | 6/2003 | Bour | H01S 5/0421 372/45.01 |
| 2004/0104399 | A1 * | 6/2004 | Ou | H01L 33/325 257/102 |
| 2006/0091404 | A1 * | 5/2006 | Shen | B82Y 20/00 257/79 |
| 2007/0009000 | A1 * | 1/2007 | Tanaka | B82Y 20/00 372/45.01 |
| 2007/0206651 | A1 * | 9/2007 | Tsai | H01L 33/14 372/45.01 |
| 2007/0278508 | A1 * | 12/2007 | Baur | H01L 33/14 257/97 |
| 2008/0054247 | A1 * | 3/2008 | Eichler | H01L 33/06 257/E29.078 |
| 2008/0112452 | A1 * | 5/2008 | Chakraborty | B82Y 20/00 438/31 |
| 2009/0121320 | A1 * | 5/2009 | Tsuda | C23C 16/34 257/613 |
| 2009/0166606 | A1 * | 7/2009 | Lee | H01L 33/06 438/37 |
| 2011/0012126 | A1 * | 1/2011 | Sumitomo | B82Y 20/00 257/E33.025 |
| 2011/0316028 | A1 * | 12/2011 | Strassburg | H01L 33/40 257/98 |
| 2013/0259079 | A1 * | 10/2013 | Bhattacharya | H01S 5/3412 977/774 |
| 2013/0285066 | A1 * | 10/2013 | Sumitomo | H01S 5/34333 438/45 |
| 2014/0327034 | A1 * | 11/2014 | Toyota | H01L 33/38 438/26 |
| 2016/0056334 | A1 * | 2/2016 | Jang | H01L 33/325 438/45 |
| 2016/0225950 | A1 * | 8/2016 | Han | H01L 33/06 |
| 2019/0115497 | A1 * | 4/2019 | Zhang | H01L 33/16 |

FOREIGN PATENT DOCUMENTS

| | | | | |
|---|---|---|---|---|
| CN | 104064644 | A * | 9/2014 | H01L 33/0075 |
| CN | 104409587 | A * | 3/2015 | H01L 33/0075 |
| CN | 105023978 | A * | 11/2015 | |
| CN | 105161586 | A * | 12/2015 | H01L 21/2056 |
| CN | 105185885 | A * | 12/2015 | |
| CN | 105470357 | A * | 4/2016 | |
| CN | 105720150 | A * | 6/2016 | H01L 33/0066 |
| CN | 106784184 | A * | 5/2017 | |
| DE | 102006046227 | A1 * | 1/2008 | B82Y 20/00 |
| DE | 10 2008 052 405 | | 4/2010 | |
| EP | 2 378 574 | | 10/2011 | |
| EP | 1221723 | B1 * | 2/2017 | H01L 33/32 |
| JP | 2007080996 | A * | 3/2007 | H01L 24/05 |
| JP | 2008526014 | A | 7/2008 | |
| JP | 5874593 | B2 * | 3/2016 | H01L 33/007 |
| KR | 101201641 | B1 * | 11/2012 | |
| KR | 20150097953 | A * | 8/2015 | |
| WO | WO-2014101649 | A1 * | 7/2014 | H01L 33/0025 |
| WO | WO-2015182207 | A1 * | 12/2015 | H01L 21/205 |
| WO | 2016/052997 | | 4/2016 | |
| WO | WO-2021173394 | A1 * | 9/2021 | |

OTHER PUBLICATIONS

Gessmann, T. et al., "Ohmic contacts to p-type GaN mediated by polarization fields in thin $In_xGa_{1-x}N$ capping layers," *Applied Physics Letters*, 80(6): pp. 986-988, Feb. 11, 2002.

* cited by examiner

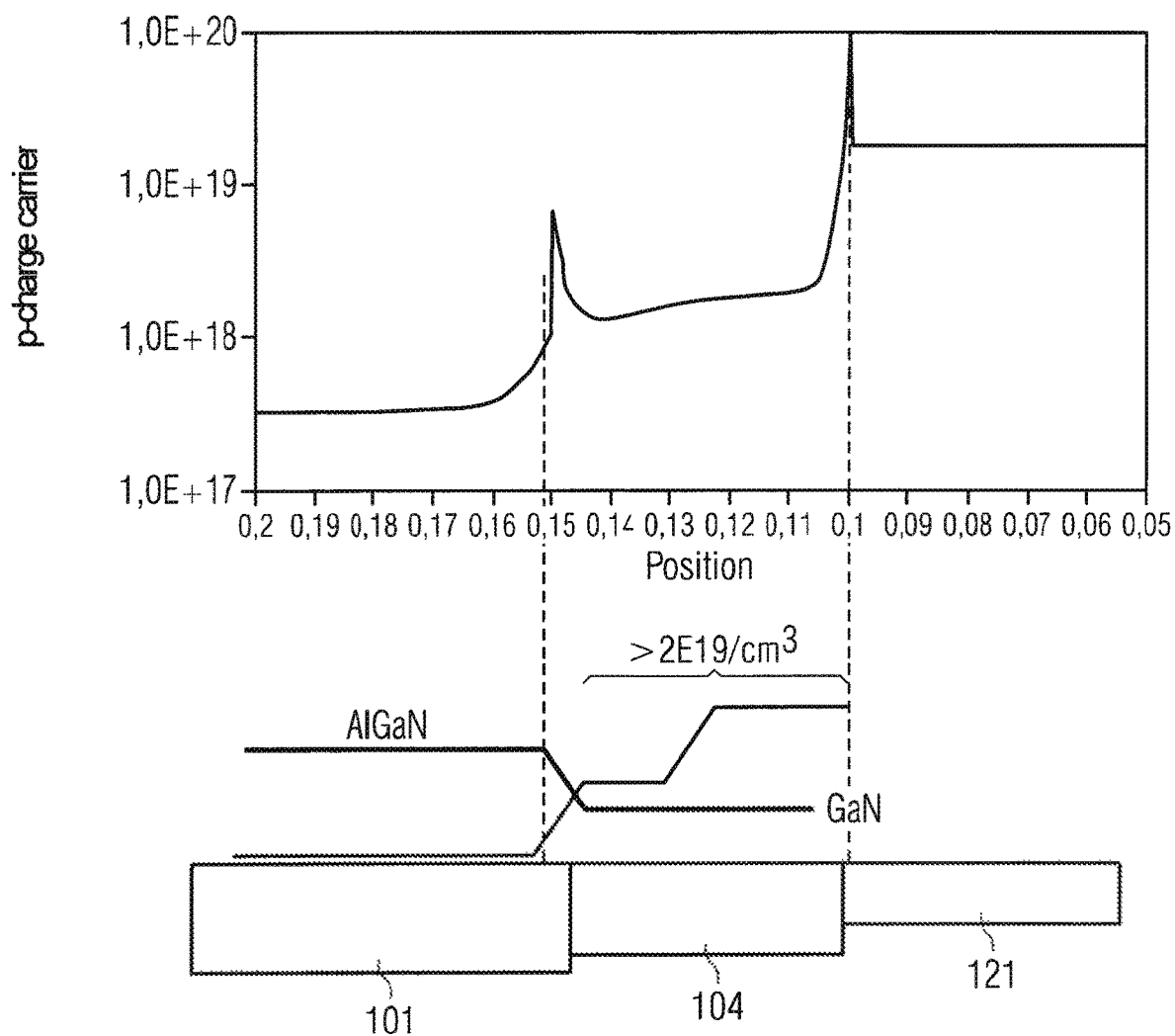

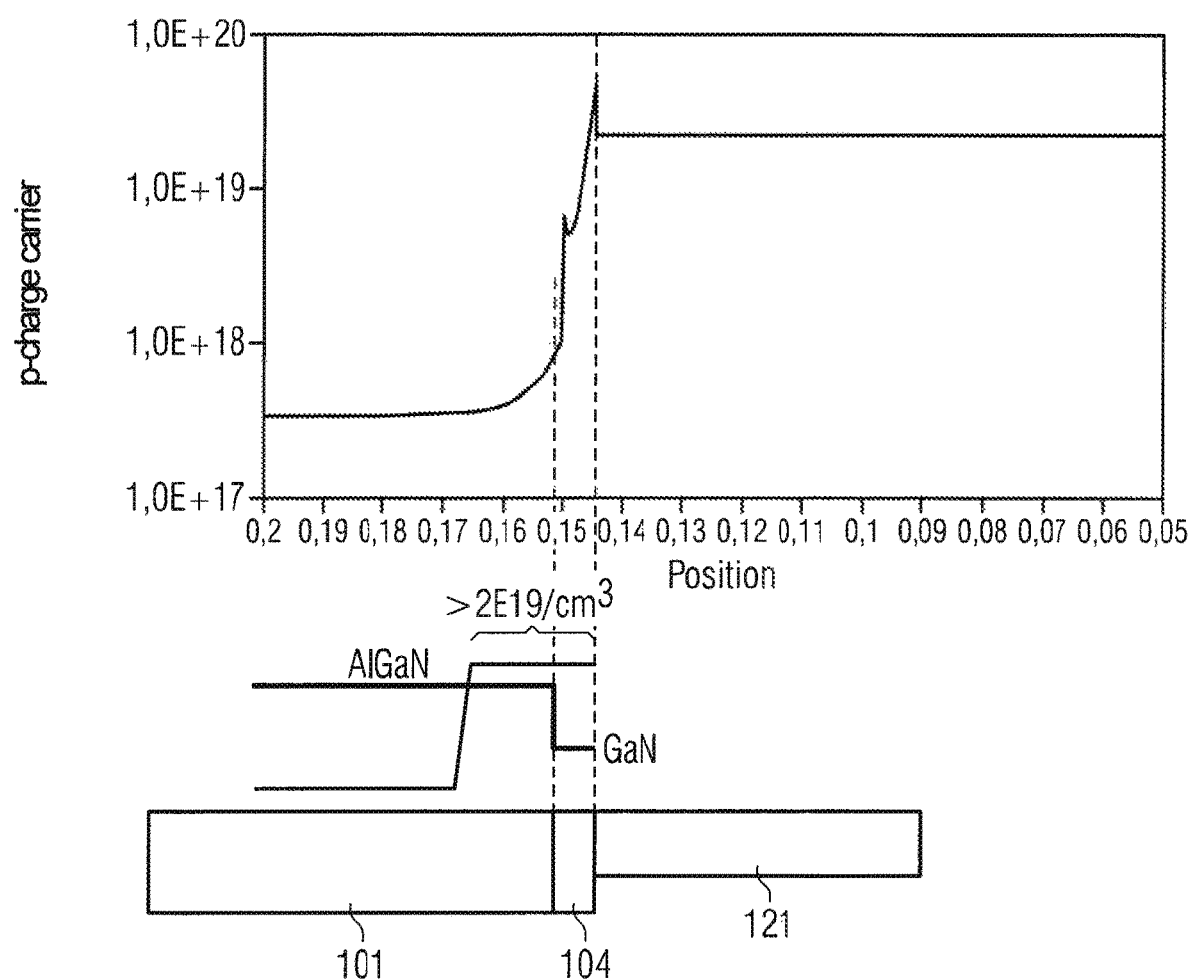

OPTOELECTRONIC SEMICONDUCTOR COMPONENT

TECHNICAL FIELD

This disclosure relates to an optoelectronic semiconductor device.

BACKGROUND

There is a need to provide an optoelectronic semiconductor device with improved electrical and/or optical properties.

SUMMARY

We provide an optoelectronic semiconductor device including a semiconductor body in which an active layer configured to generate or detect electromagnetic radiation, a first interlayer and a p-conducting contact layer are formed, and a connection layer applied to the semiconductor body, wherein the contact layer is disposed between the first interlayer and the connection layer and adjoins the connection layer, the active layer is arranged on a side of the first interlayer remote from the contact layer, the first interlayer and the contact layer are based on a nitride compound semiconductor, the contact layer is doped with a p-dopant, the contact layer has a thickness of at most 50 nm, and the contact layer includes a lower aluminum content than the first interlayer.

We also provide an optoelectronic semiconductor device including a semiconductor body in which an active layer configured to generate or detect electromagnetic radiation, a first interlayer and a p-conducting contact layer are formed, and a connection layer applied to the semiconductor body, wherein the contact layer is disposed between the first interlayer and the connection layer and adjoins the connection layer, the active layer is arranged on a side of the first interlayer remote from the contact layer, the first interlayer and the contact layer are based on a nitride compound semiconductor, the contact layer is doped with a p-dopant, the contact layer has a thickness of at most 50 nm, the contact layer includes a lower aluminum content than the first interlayer, a concentration of the p-dopant varies in a direction along a normal vector of a main extension plane of the semiconductor body within the interlayer, and has a step-shaped profile with one or more steps, and the step-shaped profile of the concentration of the p-dopant in a direction along the normal vector of the main extension plane of the semiconductor body extends at most 50 nm into the first interlayer.

We further provide an optoelectronic semiconductor device including a semiconductor body in which an active layer configured to generate or detect electromagnetic radiation, a first interlayer and a p-conducting contact layer are formed, and a connection layer applied to the semiconductor body, wherein the contact layer is disposed between the first interlayer and the connection layer and adjoins the connection layer, the active layer is arranged on a side of the first interlayer remote from the contact layer, the first interlayer and the contact layer are based on a nitride compound semiconductor, the contact layer is doped with a p-dopant, the contact layer has a thickness of at most 50 nm, the contact layer includes a lower aluminum content than the first interlayer, and a two-dimensional charge carrier gas is formed at an interface between the contact layer and the first interlayer, the distribution of which extends as far as the connection layer.

BRIEF DESCRIPTION OF THE DRAWINGS

FIGS. 3A and 3B are schematic cross sections through parts of a semiconductor body according to a second and a third example and respective associated simulation results of the p-charge carrier concentrations within the semiconductor bodies.

Figure 1:
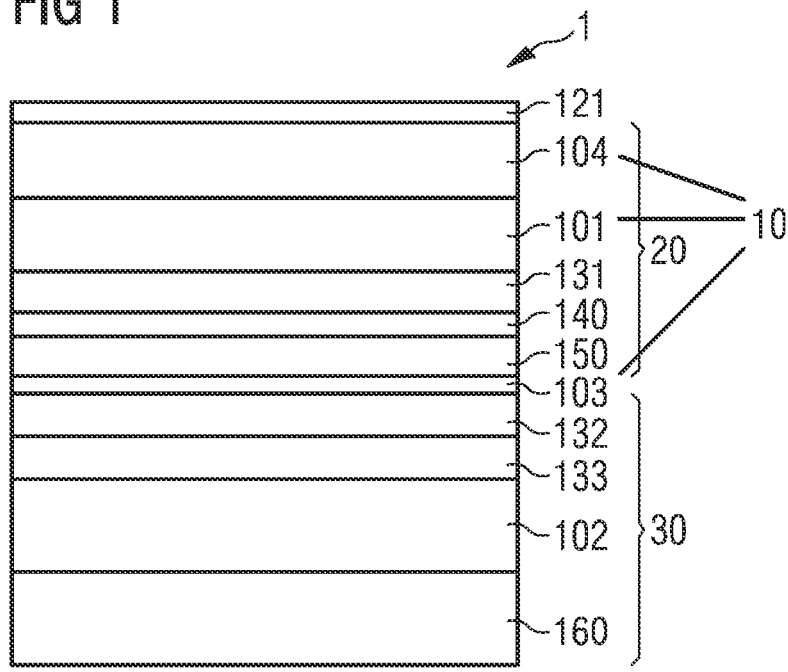
FIG. 1 is a schematic cross section through an optoelectronic semiconductor device according to a first example.

REFERENCE SIGNS LIST 1 optoelectronic semiconductor device
10 semiconductor body
20 p-conducting region
30 n-conducting region
101 first interlayer
102 second interlayer
103 active layer
104 contact layer
121 connection layer
131 first waveguide layer
132 second waveguide layer
133 third waveguide layer
140 electron blocking layer
150 spacer layer
160 buffer layer
A optoelectronic semiconductor device according to the second example
B optoelectronic semiconductor device according to the third example
I current
V voltage

DETAILED DESCRIPTION

Our optoelectronic semiconductor device may be part of an electronic or optoelectronic component. For example, the optoelectronic component formed with the optoelectronic semiconductor device is a radiation emitting or radiation detecting component such as a light emitting diode chip, a laser diode chip or a photodiode chip. In particular, the optoelectronic semiconductor device may emit or detect electromagnetic radiation during normal operation.

In accordance with at least one example of the optoelectronic semiconductor device, the optoelectronic semiconductor device comprises a semiconductor body having an active region configured to generate or detect electromagnetic radiation, a first interlayer and a p-conducting contact layer, as well as a connection layer applied to the semiconductor body.

The contact layer is located between the first interlayer and the connection layer and is adjacent to the connection layer. Preferably, the connection layer is directly adjacent to the contact layer. In other words, the contact layer on the connection layer is the outermost layer of the semiconductor body and the connection layer is applied directly to the contact layer. Alternatively, it can be provided that the connection layer borders indirectly on the contact layer and a further layer is provided between the contact layer and the connection layer, for example, to improve the electrical contact properties or adhesion of the connection layer to the semiconductor body.

The active layer is arranged on a side of the first interlayer facing away from the contact layer. The active layer preferably comprises a pn junction, a double heterostructure, a single quantum well (SQW) or, especially preferred, a multi quantum well (MQW) for radiation generation.

The first interlayer and the contact layer are based on a nitride compound semiconductor material and are preferably grown epitaxially. "Based on nitride compound semiconductors" means that the semiconductor body, in particular the active layer, comprises a nitride III/V compound semiconductor material, preferably $Al_nGa_mIn_{1-n-m}N$, wherein $0 \le n \le 1$, $0 \le m \le 1$ and $n+m \le 1$. This material does not necessarily have to have a mathematically exact composition according to the above formula. Rather, it may contain one or more dopants and additional components that essentially do not alter the characteristic physical properties of the $Al_nGa_mIn_{1-n-m}N$ material. For simplicity's sake, the above formula contains only the essential components of the crystal lattice (Al, Ga, In, N), even if they may be partially replaced by small amounts of other substances.

The contact layer may be doped with a p-dopant. This means that the contact layer is p-conducting and can, for example, be doped with magnesium or zinc. The contact layer establishes an electrically conductive contact between the first interlayer and the connection layer.

The contact layer may have a thickness of at most 50 nm, preferably a thickness of at most 30 nm and particularly preferably a thickness of at most 10 nm. This means that the extension of the contact layer parallel to a normal vector of its main plane of extension is at most 50 nm, preferably at most 30 nm and particularly preferably at most 10 nm. A small layer thickness of the contact layer reduces the electrical resistance of the contact layer that further advantageously reduces the forward voltage of the optoelectronic semiconductor device. Furthermore, a piezo effect occurring at the transition from the first interlayer to the contact layer due to a lattice mismatch of the materials of the contact layer and the first interlayer can be used to generate free charge carriers, thus achieving a further advantageous reduction of the forward voltage.

The contact layer may comprise a lower aluminum content than the first interlayer. This means that the aluminum concentration in the contact layer is lower than in the first interlayer. The optical properties of the semiconductor material can be changed by adding aluminum, whereby in particular the optical refractive index of a gallium nitride compound semiconductor material can be reduced by adding aluminum. Thus, a waveguide effect based on total internal reflection at interfaces can be generated and thus, for example, the guidance of an electromagnetic wave can be achieved.

The optoelectronic semiconductor device may comprise a semiconductor body in which an active layer configured to generate or detect electromagnetic radiation, a first interlayer and a p-conducting contact layer are formed, and a connection layer applied to the semiconductor body, wherein the contact layer is disposed between the first interlayer and the connection layer and adjoins the connection layer,
the active layer is arranged on a side of the first interlayer facing away from the contact layer,
the first interlayer and the contact layer are based on a nitride compound semiconductor,
the contact layer is doped with a p-dopant,
the contact layer has a thickness of at most 50 nm, and
the contact layer comprises a lower aluminum content than the first interlayer.

Our optoelectronic semiconductor device is based, among other things, on the following considerations. To electrically connect a metal connection layer with a p-doped semiconductor contact layer, a contact layer with high p-doping is required. Since doping gradients are usually limited, a certain minimum thickness of the contact layer is required to achieve the desired high doping of the contact layer.

The optoelectronic semiconductor device, among other things, exploits the piezoelectric effect at the transition between the contact layer and the first interlayer due to the lattice mismatch by a thin contact layer. Due to the piezo effect, which is based on the different lattice constants of the two semiconductor layers, a high concentration of free charge carriers can form at the interface between the contact layer and the first interlayer. This high concentration of free charge carriers can contribute advantageously to a better ohmic contact between a metallic connection layer and the semiconductor material of the contact layer. These measures can advantageously reduce the forward voltage of the semiconductor device. This makes it possible to produce a semiconductor device with increased efficiency. The reduced aluminum content of the contact layer compared to the first interlayer allows a higher p-doping of the contact layer and thus a particularly good p-contact.

The contact layer may be free of aluminum or comprise an aluminum content of less than 1%. Due to the low aluminum content, the contact layer may have a particularly high p-doping.

The first interlayer may be formed from an aluminum gallium nitride or an aluminum indium gallium nitride. The first interlayer can have an aluminum content of at least 5% that can increase the transparency of the first interlayer compared to the contact layer.

The contact layer may be formed from an indium gallium nitride. The lattice constants of indium gallium nitride and aluminum gallium nitride show an advantageously large difference. This intensifies the piezoelectric effect at the interface of the contact layer and the first interlayer and more free charge carriers can be generated.

The connection layer may be a metallic layer or formed from a transparent, conductive oxide (TCO). A metallic layer contains or consists of at least one metal or metal alloy. For example, a TCO may consist of an indium tin oxide.

A two-dimensional charge carrier gas may be formed at the interface between the contact layer and the first interlayer, the distribution of which extends as far as the connection layer. The term "extends" means that the concentration of the free charge carriers decreases from the interface between the contact layer and the first interlayer along the direction of a normal vector of the main extension plane of the semiconductor body up to the connection layer by at most 90%, preferably by at most 45% and particularly preferably by at most 20%. This means that the concentration of free charge carriers at the connection layer is still at least 10%, preferably at least 55% and particularly preferably at least 80% of the value at the interface between the contact layer and the first interlayer. A high concentration of free charge carriers at the junction between the contact layer and the connection layer allows an advantageously low electrical resistance and thus a high efficiency of the optoelectronic semiconductor device.

The first interlayer may be doped with the p-dopant at least on the side facing the contact layer. This means that the p-dopant from the contact layer extends at least into the first interlayer. This facilitates a high doping of the contact layer, which allows the contact layer to be thinner.

The contact layer may have a p-dopant concentration of at least $2\times10^{19}$ atoms per cubic centimeter, preferably at least $6\times10^{19}$ atoms per cubic centimeter, and particularly preferably at least $1\times10^{20}$ atoms per cubic centimeter. A high concentration of free charge carriers within the contact layer allows an advantageously low electrical resistance at the transition from the contact layer to the connection layer.

The first interlayer or a portion of the first interlayer may have a p-dopant concentration of at least $1\times10^{19}$ atoms per cubic centimeter. Preferably, the first interlayer or a portion of the first interlayer has a dopant concentration of at least $2\times10^{19}$ atoms per cubic centimeter. In addition, an even higher dopant concentration in the first interlayer or a portion of the first interlayer, e.g. $6\times10^{19}$ atoms per cubic centimeter or $1\times10^{20}$ atoms per cubic centimeter, may also be appropriate. For the electrical conductivity within a semiconductor material, there is an optimum dopant concentration at a value of about $2\times10^{19}$ atoms per cubic centimeter. It is therefore advantageous to adjust the dopant concentration to this value to reduce the electrical resistance of the first interlayer or part of the first interlayer. Further, the first interlayer or a portion of the first interlayer preferably has a lower concentration of p-dopant than the contact layer.

The concentration of the p-dopant may vary in a direction along a normal vector of a main plane of extension of the semiconductor body and may have a step-shaped profile with one or more steps and/or a ramp-shaped profile with one or more ramps. The main extension plane of the semiconductor body may be perpendicular to the stacking direction of the semiconductor body. Furthermore, the steps or ramps of the dopant concentration may also have different inclinations. To keep the penetration depth of the p-dopant into the first interlayer as low as possible, it is advantageous to choose an abrupt increase in the dopant concentration with the largest possible gradient. For example, the dopant concentration of the p-dopant has a gradient of at least $1\times10^{20}$ atoms per cubic centimeter per 100 nm and preferably a gradient of at least $1\times10^{20}$ atoms per cubic centimeter per 30 nm.

The concentration of the p-dopant may vary in a direction along the normal vector of a main extension plane of the semiconductor body within the interlayer and, in particular, may have a step-shaped profile with one or more steps and/or a ramp-shaped profile with one or more ramps. This means that the concentration of the p-dopant already increases within the interlayer. This makes it easier to achieve a sufficiently high dopant concentration in the subsequent contact layer.

The step-shaped profile of the concentration of the p-dopant in a direction along a normal vector of the main plane of extension of the semiconductor body may extend at most 50 nm, preferably at most 30 nm and particularly preferably at most 10 nm into the first interlayer. This keeps the concentration of free charge carriers low within the first interlayer. A low carrier concentration within the first interlayer is advantageous for a low optical absorption of the electromagnetic radiation, which partially propagates within the first interlayer.

The contact layer may be p-conductively doped, for example, with the dopant magnesium, zinc or carbon.

The semiconductor device may be configured as a semiconductor laser and the active layer may generate coherent electromagnetic radiation. A semiconductor laser may be characterized by generation of coherent electromagnetic radiation by stimulated emission.

The active layer may at least be partially surrounded by a waveguide region. The first interlayer can be formed as a cladding layer adjacent to the waveguide region, or the first interlayer itself forms the waveguide region. The waveguide region can be formed of one or more layers. The waveguide region is essentially characterized by its optical refractive index, which differs from that of its surroundings. The refractive index jump at the boundary surfaces of the waveguide region enables total internal reflection of electromagnetic radiation and thus causes guidance of the electromagnetic radiation. This increases the optical efficiency of the optoelectronic semiconductor device.

The electromagnetic radiation may have a wavelength of less than or equal to 400 nm, in particular of less than or equal to 360 nm. The semiconductor device can also be an incoherent radiation source such as an UV-LED.

The contact layer may have a thickness of 30 nm or less, preferably 10 nm or less. To take advantage of a piezoelectric effect occurring at the interface of the first interlayer and the contact layer, it is advantageous to make the contact layer as thin as possible so that the connection layer is located close to this interface of the first interlayer and the contact layer. At the same time, the contact layer should have a sufficient thickness to be able to build up a sufficiently high dopant concentration at the interface of the contact layer and the connection layer.

The active layer may generate electromagnetic radiation and the semiconductor device may comprise a reduced forward voltage during operation. Reduced forward voltage means that the device has a lower forward voltage than a device with the same parameters, in particular layer thicknesses and doping and a contact layer thickness of at least 60 nm.

Further advantages and advantageous designs of the semiconductor body result from the following examples shown in connection with the figures.

Same, similar or similarly acting elements are provided with the same reference signs in the figures. The figures and the proportions of the elements depicted in the figures are not to be regarded as true to scale, unless units are expressly indicated. Rather, individual elements may be exaggeratedly large for better representability and/or comprehensibility.

FIG. 1 shows a schematic cross section through an optoelectronic semiconductor device 1 according to a first example. The optoelectronic semiconductor device 1 comprises a semiconductor body 10 with an active layer 103 configured to generate electromagnetic radiation, a first interlayer 101 and a p-conducting contact layer 104. A connection layer 121 is applied to the semiconductor body 10, which electrically contacts the semiconductor body 10 and can be formed, for example, of a metal or a metal alloy. Further, the optoelectronic semiconductor device 1 comprises a p-conducting region 20 and an n-conducting region 30. The p-conducting region 20 comprises a spacer layer 150, an electron blocking layer 140, a first waveguide layer 131, the first interlayer 101 and the p-conducting contact layer 104. All layers of the p-conducting region are doped with magnesium or zinc, for example, and have a p-type conductivity. The n-conducting region 30 comprises a second interlayer 102, a second waveguide layer 132, a third waveguide layer 133 and a buffer layer 160. All layers of the n-conducting region 30 are doped with silicon or oxygen, for example, and have an n-type conductivity. The semiconductor layers are based on a gallium nitride compound semiconductor material and are preferably grown epitaxially on a growth substrate. The active layer 103 is configured for emission of electromagnetic radiation and preferably has a pn junction, a double heterostructure, a single quantum well (SQW) or, particularly preferred, a multi quantum well (MQW). By the waveguide layers 131, 132, 133 a waveguide is formed surrounding the active layer 103 in which the generated electromagnetic radiation is guided. The electron blocking layer 140 encloses the charge carriers in the active layer 103. This advantageously increases the radiative recombination probability and thus efficiency of the optoelectronic semiconductor device 1. The active layer 103 is surrounded by the spacer layer 150 and the second waveguide layer 132. Together with the first waveguide layer 131 and the third waveguide layer 133, the spacer layer 150 and the second waveguide layer 132 form a waveguide region that can be used to guide the electromagnetic radiation generated during operation in the active layer 103. In this example, the first interlayer 101 and the second interlayer 102 perform the task of a cladding layer that keeps the guided electromagnetic radiation away from the contact layer 104 and the buffer layer 160 to keep optical absorption advantageously low.

Figure 2:
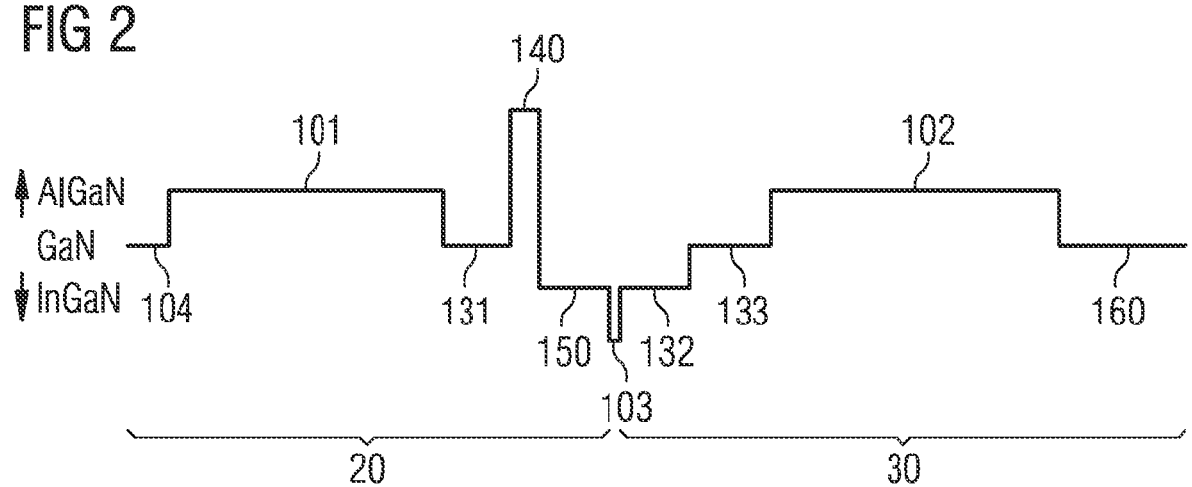
FIG. 2 shows the band structure within an optoelectronic semiconductor device according to the first example.

FIG. 2 shows the band structure within an optoelectronic semiconductor device 1 according to the first example. The course of the band structure is determined by the chemical composition of the semiconductor body. The higher the aluminum concentration in a gallium nitride semiconductor, the greater the band gap distance. An increase in the indium concentration, on the other hand, causes a reduction in the band gap distance. From left to right, the contact layer 104, the first interlayer 101, the first waveguide layer 131, the electron blocking layer 140, the spacer layer 150, the active layer 103, the second waveguide layer 132, the third waveguide layer 133, the second interlayer 102 and the buffer layer 160 are visible in the band gap course within the semiconductor body 10.

FIG. 3A shows a schematic cross section through the first interlayer 101, the contact layer 104 and the connection layer 121 of an optoelectronic semiconductor device 1 according to a second example and a simulation result of the p-charge carrier concentration within the first interlayer 101, the contact layer 104 and the connection layer 121. The part of a semiconductor body 10 shown here has a first interlayer 101, a contact layer 104 and a connection layer 121. The contact layer 104 has an expansion along a normal vector of the main plane of the semiconductor layers of more than 50 nm.

Above the cross section of the semiconductor body 10 shown, a simulation result of the charge carrier concentrations within the semiconductor body 10 is shown. It can be seen that a local maximum of the free charge carrier concentration is formed at the interface between the first interlayer 101 and the contact layer 104. This local maximum is based on the piezo effect caused by the lattice mismatch between the first interlayer 101 and the contact layer 104. A further increase in the free charge carrier concentration can be seen when the connection layer 121 is reached. The charge carrier concentration at the interface of the contact layer 104 and the connection layer 121 reaches its maximum at a value of about $1 \times 10^{20}$ charge carriers per cubic centimeter. The contact layer 104, for example, is doped with magnesium. The course of the magnesium concentration and the course of the aluminum content are shown in the graphs between the simulation result and the schematic cross section through the semiconductor body. The local coordinates of the dopant concentrations and the schematic cross section are identical. The first interlayer 101 has a high aluminum content that only decreases strongly at the transition from the first interlayer 101 to the contact layer 104. The magnesium concentration within the first interlayer 101 is adjusted to an optimum value of $2 \times 10^{19}$ atoms per cubic centimeter for the electrical conductivity, takes a stepwise increasing form within the contact layer 104 and reaches a value of greater than $2 \times 10^{19}$ atoms per cubic centimeter. Due to an expansion of the contact layer of more than 50 nm, the piezo effect contributes very little to generation of free charge carriers for the transition from contact layer 104 to connection layer 121.

FIG. 3B shows a schematic cross section through the first interlayer 101, the contact layer 104 and the connection layer 121 of an optoelectronic semiconductor device 1 according to a third example and a simulation result of the p-charge carrier concentration within the first interlayer 101, the contact layer 104 and the connection layer 121. The third example essentially corresponds to the second example except for the extension of the contact layer along a normal vector of the semiconductor layers. The contact layer 104 in the third example has an expansion along the stacking direction of less than 10 nm. To achieve a sufficiently high dopant concentration for contacting the connection layer 121 despite this small expansion of the contact layer, the magnesium concentration already increases strongly within the first interlayer 101 and reaches a concentration of more than $2 \times 10^{19}$ atoms per cubic centimeter at the interface of the contact layer 104 with the connection layer 121. In the associated simulation result, it can be seen that the metallic connection layer 121 is arranged so close to the interface between the first interlayer 101 and the contact layer 104 that the free charge carriers generated by the piezo effect can be used to contact the connection layer 121. The piezo effect thus contributes to an increase in the free charge carrier density at the transition from connection layer 121 to contact layer 104 and advantageously reduces the forward voltage of the optoelectronic semiconductor device 1.

Figure 4A:
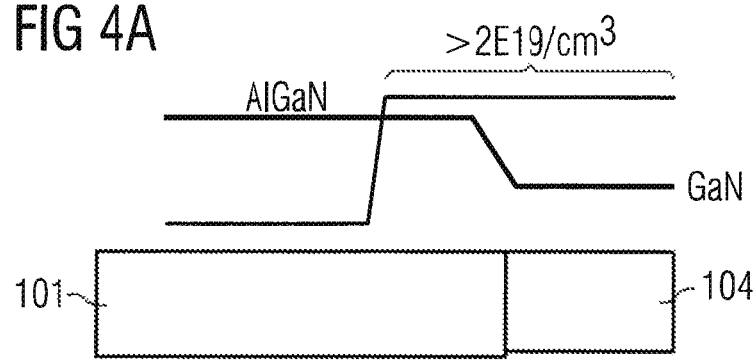
FIGS. 4A to 4C, 5A to 5C, 6A to 6C, 7A to 7C and 8A to 8D are schematic cross sections through the first interlayer and the contact layer of optoelectronic semiconductor bodies of various examples and associated doping profiles.
Figure 4B:
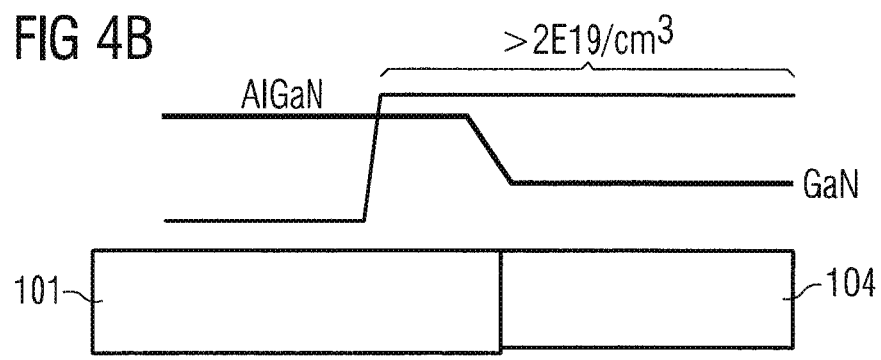
Figure 4C:
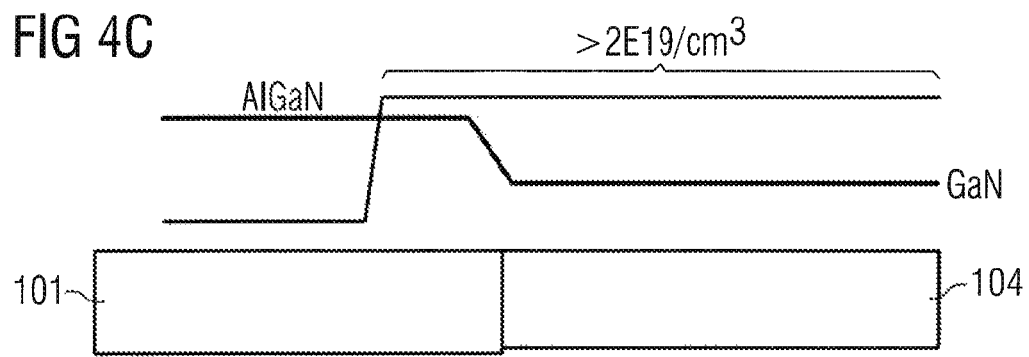

FIGS. 4A to 4C show schematic cross sections through the first interlayer 101 and the contact layer 104 of an optoelectronic semiconductor device 1 in different examples and the corresponding profiles of the aluminum content and the magnesium concentration. The aluminum content within the first interlayer 101 is about 6% and drops sharply at the transition to the contact layer 104. The magnesium concentration within the first interlayer 101 is about $2 \times 10^{19}$ atoms per cubic centimeter and rises sharply to a value above $2 \times 10^{19}$ atoms per cubic centimeter before the transition from the first interlayer 101 to the contact layer 104. FIGS. 4A to 4C differ in the extent of the contact layer 104 adjacent to the first interlayer 101 along its stacking direction. The thickness of the contact layer varies between 10 nm in FIG. 4A and 50 nm in FIG. 4C. As the thickness of the contact layer decreases, the useful piezoelectric effect for contacting the metallic connection layer is enhanced.

Figure 5A:
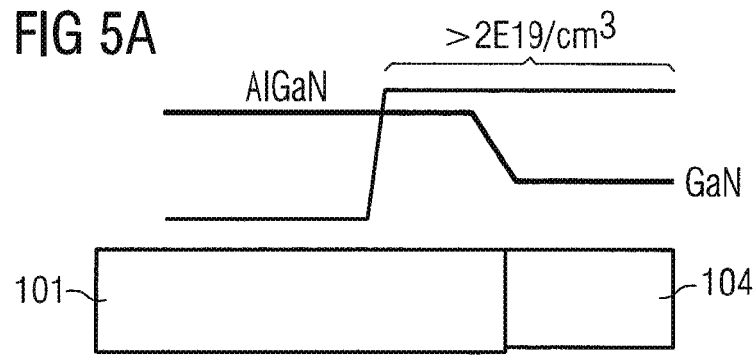
Figure 5B:
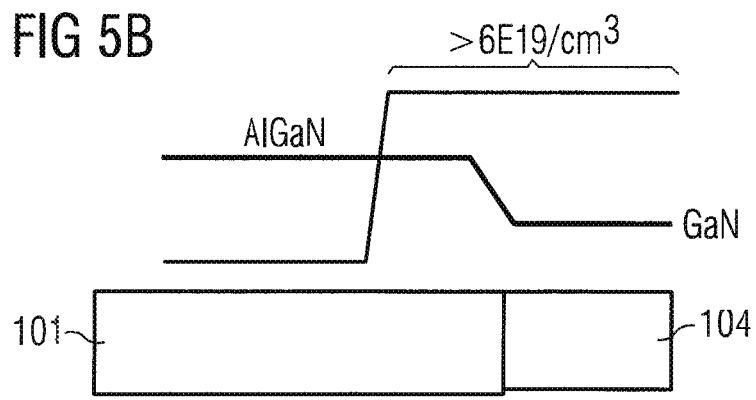
Figure 5C:
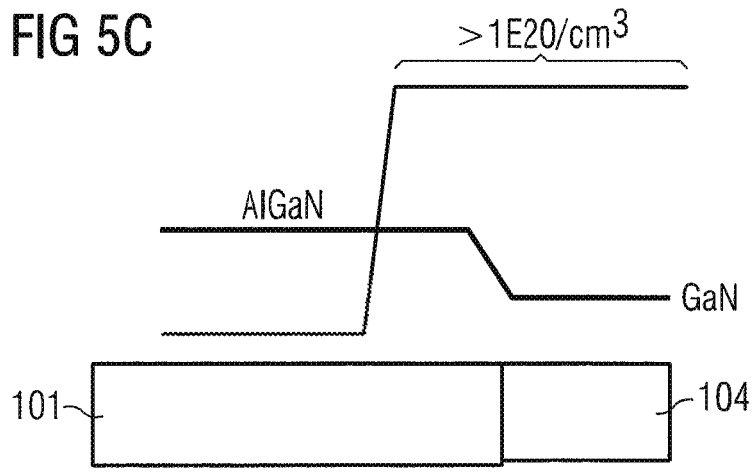

FIGS. 5A to 5C show schematic cross sections through the first interlayer 101 and the contact layer 104 of an optoelectronic semiconductor device 1 in various examples and the corresponding profiles of the aluminum content and the magnesium concentration. The profiles of the aluminum content match the profiles from FIGS. 4A to 4C. The examples in FIGS. 5A to 5C essentially differ from each other in the height of the magnesium dopant concentrations in the first interlayer 101 and the adjacent contact layer 104 along their stacking direction. The shape of the magnesium concentration profiles essentially matches the shape of the magnesium concentration profiles in FIGS. 4A to 4C, with the maximum level of dopant concentration varying in a range of at least $2\times10^{19}$ atoms per cubic centimeter in FIG. 5A to a maximum of $1\times10^{20}$ atoms per cubic centimeter in FIG. 5C. The higher the dopant concentration, the lower the contact resistance to the connection layer 121.

Figure 6A:
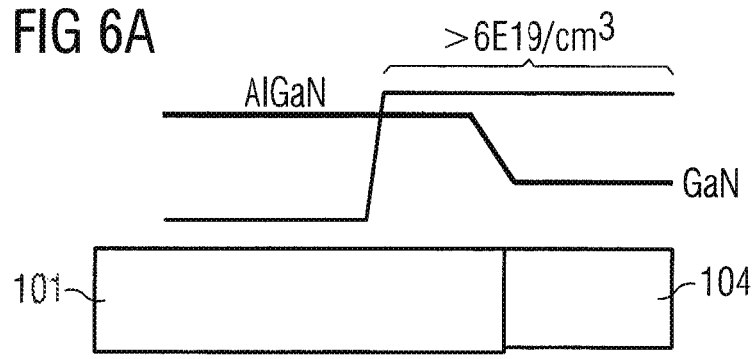
Figure 6B:
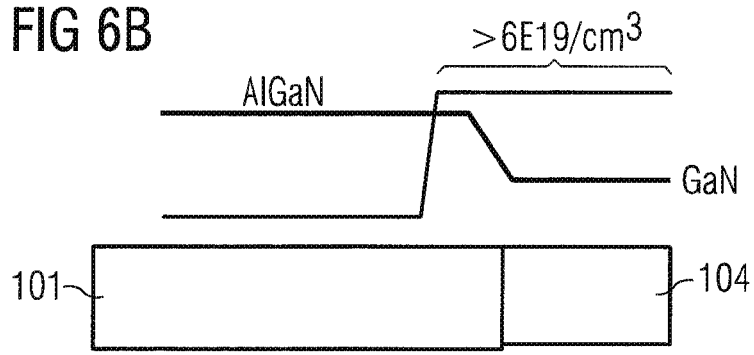
Figure 6C:
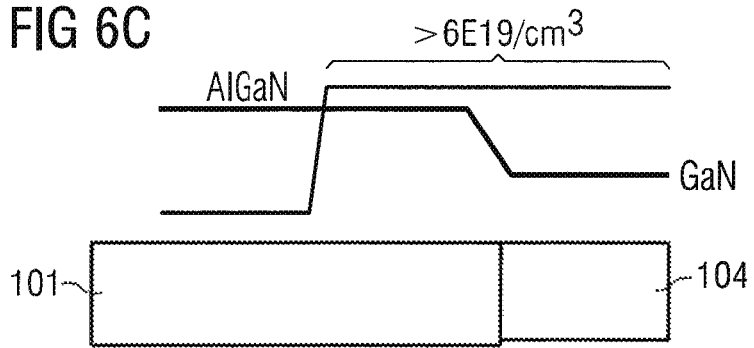

FIGS. 6A to 6C show schematic cross sections through the first interlayer 101 and the contact layer 104 of an optoelectronic semiconductor device 1 in different examples and the corresponding profiles of the aluminum content and the magnesium concentration. The profiles of the aluminum content match the profiles from FIGS. 4A to 4C. The examples in FIGS. 6A to 6C differ in the depth of the doping. In this context, the depth of the doping means the penetration depth of the magnesium doping into the first interlayer 101. This doping depth varies between a maximum of 50 nm in FIG. 6C and a minimum of 10 nm in FIG. 6B. A greater penetration depth has the advantage that a shallower increase in the dopant concentration is sufficient to achieve a sufficiently high dopant concentration at the end of the contact layer. At the same time, only a low penetration depth allows an advantageously low optical absorption within the first interlayer 101.

Figure 7A:
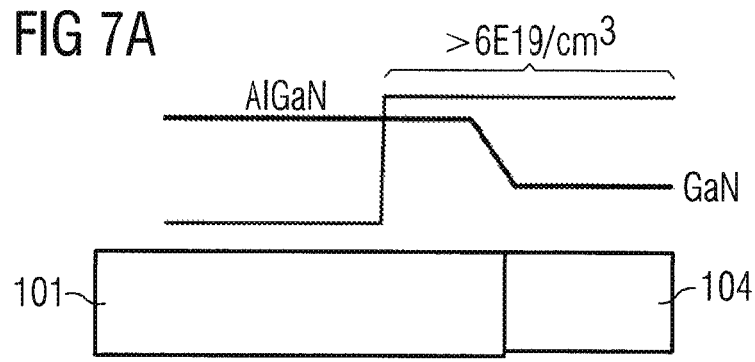
Figure 7B:
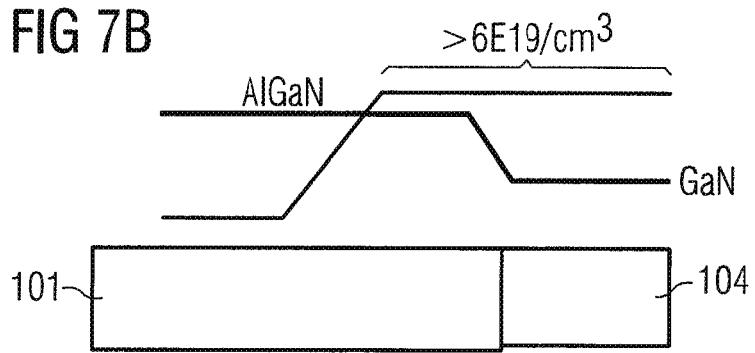
Figure 7C:
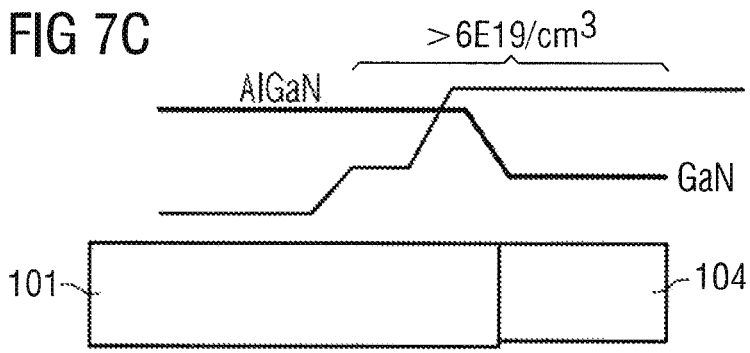
Figure 8A:
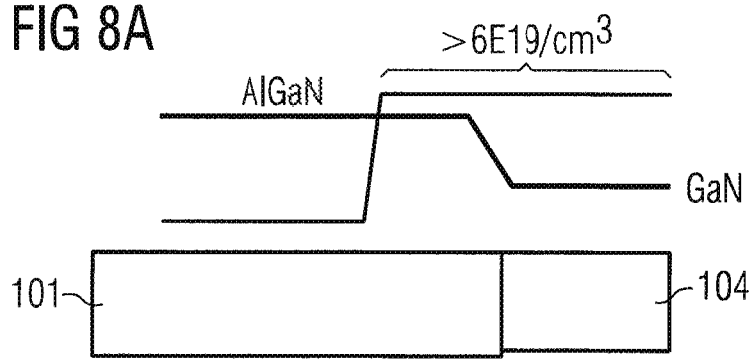
Figure 8B:
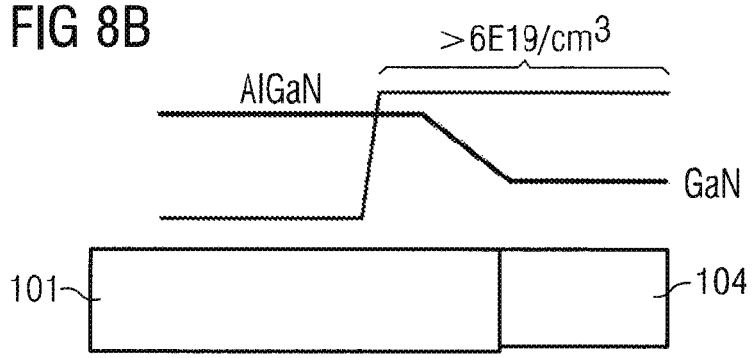
Figure 8C:
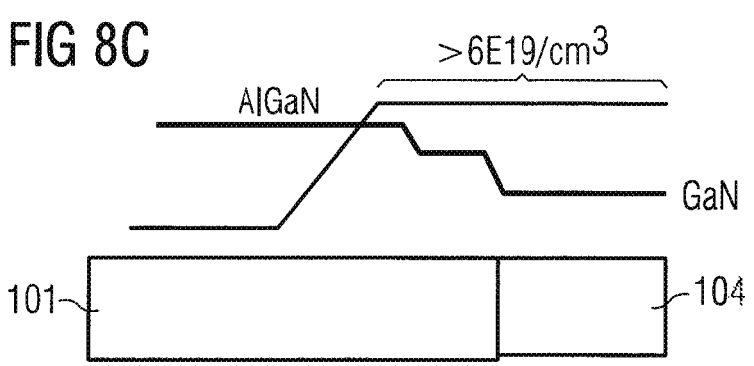
Figure 8D:
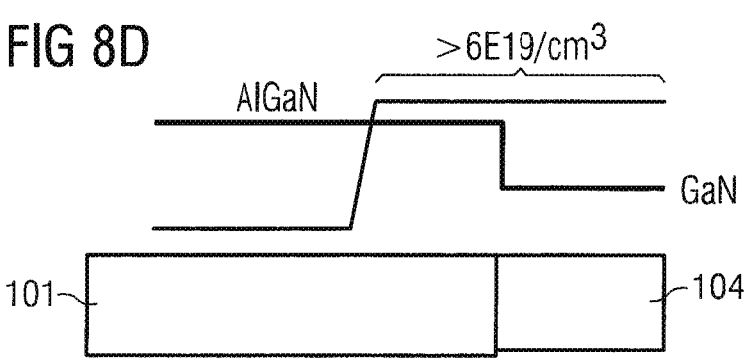

FIGS. 7A to 7C show schematic cross sections through the first interlayer 101 and the contact layer 104 of an optoelectronic semiconductor device 1 in different examples and the corresponding profiles of the aluminum content and the magnesium concentration. The profiles of the aluminum content match the profiles from FIGS. 4A to 4C. The examples in FIGS. 7A to 7C differ in the shape and slope of the magnesium concentration profiles. The increase in magnesium concentration can either be abrupt, as in FIG. 7A, or continuous, as in FIG. 7B, or it can be in several steps of different gradient, as in FIG. 7C. For example, the magnesium concentration has a gradient of at least $1\times10^{20}$ atoms per cubic centimeter per 100 nm and preferably a gradient of at least $1\times10^{20}$ atoms per cubic centimeter per 30 nm. A large gradient of the magnesium concentration allows a low penetration depth of the magnesium into the first interlayer 101, whereby the optical absorption within the first interlayer 101 can be kept advantageously low. In other words, an increase as abrupt as possible is advantageous for high efficiency.

FIGS. 8A to 8D show schematic cross sections through the first interlayer 101 and the contact layer 104 of an optoelectronic semiconductor device 1 in different examples and the corresponding profiles of the aluminum content and the magnesium concentration. The profiles of the magnesium concentration match the profiles from FIGS. 4A to 4C. The examples in FIGS. 8A to 8D differ in the characteristics of the aluminum content profiles. The aluminum content may decrease continuously as in FIGS. 8A and 8B, or abruptly as in FIG. 8D. For example, a multi-step gradient with different gradient values, as in FIG. 8C, can also determine the ramp. A particularly large lattice mismatch and thus an advantageously large occurrence of the piezo effect at the boundary layer between the first interlayer 101 and the contact layer 104 results from a course that is as abrupt as possible.

Figure 9:
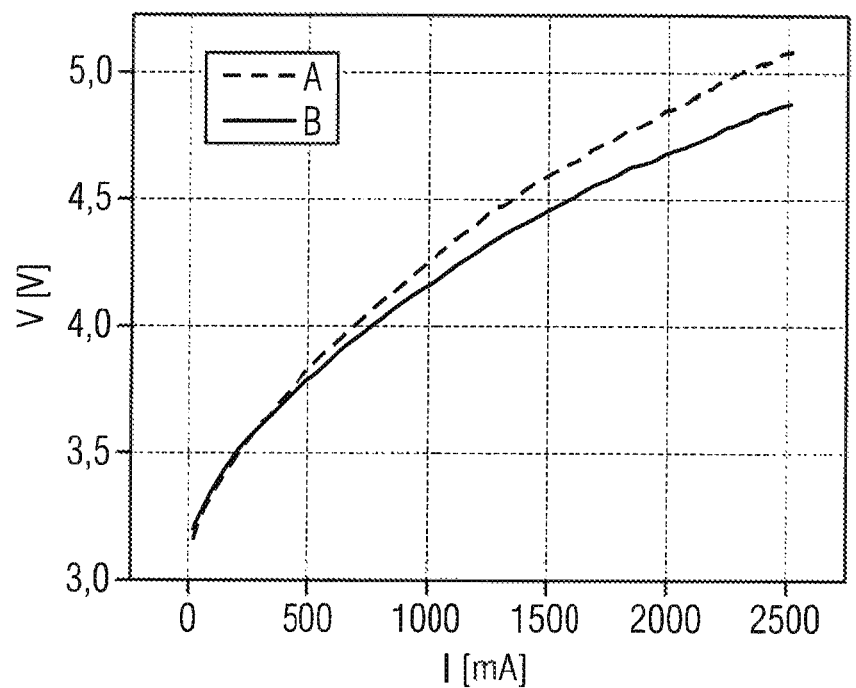
FIG. 9 shows the forward voltage as a function of the current of an optoelectronic semiconductor device according to the second and third examples.

FIG. 9 shows the forward voltage as a function of the current of an optoelectronic semiconductor device 1 according to the second and third examples. The second example is shown in the graph marked with the letter A, while the third example is shown in the graph marked with the letter B. The forward voltage V in volts is plotted above the operating current I of the optoelectronic semiconductor device in milliamperes. It can be seen that the forward voltage values are advantageously reduced as a function of the current for the optoelectronic device B according to the third example. A reduced forward voltage simultaneously increases the electrical efficiency of the optoelectronic semiconductor device 1.

Our components and devices are not limited by the description based on the examples. Rather, this disclosure includes each new feature as well as each combination of features, which in particular includes each combination of features in the appended claims, even if the feature or combination itself is not explicitly stated in the claims or examples.

This application claims priority of DE 102017119931.4, the subject matter of which is incorporated herein by reference.

The invention claimed is:

1. An optoelectronic semiconductor device comprising a semiconductor body in which an active layer configured to generate or detect electromagnetic radiation, a first interlayer and a p-conducting contact layer are formed, and a connection layer applied to the semiconductor body, wherein
    the contact layer is disposed between the first interlayer and the connection layer and adjoins the connection layer,
    the active layer is arranged on a side of the first interlayer remote from the contact layer,
    the first interlayer and the contact layer are based on a nitride compound semiconductor,
    the contact layer is doped with a p-dopant,
    the contact layer has a thickness of at most 50 nm,
    the contact layer comprises a lower aluminum content than the first interlayer, and
    a lattice mismatch of the materials of the contact layer and the first interlayer generates free charge carriers as a result of a piezo effect occurring at a transition from the first interlayer to the contact layer.

2. The optoelectronic semiconductor device according to claim 1, wherein the contact layer is free of aluminum or has an aluminum content of 1% or less.

3. The optoelectronic semiconductor device according to claim 1, wherein the first interlayer is formed of an aluminum gallium nitride or an aluminum indium gallium nitride.

4. The optoelectronic semiconductor device according to claim 1, wherein the contact layer is formed of an indium gallium nitride.

5. The optoelectronic semiconductor device according to claim 1, wherein the connection layer is a metallic layer or a layer formed from a TCO.

6. The optoelectronic semiconductor device according to claim 1, wherein the first interlayer is doped with the p-dopant at least on a side facing towards the contact layer.

7. The optoelectronic semiconductor device according to claim 1, wherein the contact layer has a p-dopant concentration of at least $2\times10^{19}$ atoms per cubic centimeter.

8. The optoelectronic semiconductor device according to claim 1, wherein the first interlayer or a partition of the first interlayer has a p-dopant concentration of at least $1\times10^{19}$ atoms per cubic centimeter.

9. The optoelectronic semiconductor device according to claim 8, wherein the concentration of the p-dopant varies in a direction along a normal vector of a main extension plane of the semiconductor body, and has a step-shaped profile with one or more steps and/or a ramp-shaped profile with one or more ramps.

10. The optoelectronic semiconductor device according to claim 9, wherein the concentration of the p-dopant varies in a direction along the normal vector of a main extension plane of the semiconductor body within the interlayer and has a step-shaped profile with one or more steps and/or a ramp-shaped profile with one or more ramps.

11. The optoelectronic semiconductor device according to claim 9, wherein the step-shaped profile of the concentration of the p-dopant in a direction along a normal vector of the main plane of extension of the semiconductor body extends at most 50 nm into the first interlayer.

12. The optoelectronic semiconductor device according to claim 1, wherein the contact layer is p-conductively doped with the dopant magnesium or zinc.

13. The optoelectronic semiconductor device according to claim 1, wherein the optoelectronic semiconductor device is formed as a semiconductor laser, and the active layer is arranged to generate coherent electromagnetic radiation.

14. The optoelectronic semiconductor device according to claim 13, wherein the active layer is surrounded at least in regions by a waveguide region, and the first interlayer is a cladding layer adjoining the waveguide region, or the first interlayer forms the waveguide region.

15. The optoelectronic semiconductor device according to claim 1, wherein the electromagnetic radiation emitted in operation in the active layer has a wavelength less than or equal to 400 nm.

16. The optoelectronic semiconductor device according to claim 1, wherein the contact layer has a thickness of at most 30 nm.

17. The optoelectronic semiconductor device according to claim 1, wherein the active layer is arranged to generate electromagnetic radiation and the optoelectronic semiconductor device has a reduced forward voltage during operation.

18. The optoelectronic semiconductor device according to claim 1, wherein a dopant concentration of the p-dopant has a gradient of at least $1 \times 10^{20}$ atoms per cubic centimeter per 100 nm.

19. An optoelectronic semiconductor device comprising a semiconductor body in which an active layer configured to generate or detect electromagnetic radiation, a first interlayer and a p-conducting contact layer are formed, and a connection layer applied to the semiconductor body, wherein
   the contact layer is disposed between the first interlayer and the connection layer and adjoins the connection layer,
   the active layer is arranged on a side of the first interlayer remote from the contact layer,
   the first interlayer and the contact layer are based on a nitride compound semiconductor,
   the contact layer is doped with a p-dopant,
   the contact layer has a thickness of at most 50 nm,
   the contact layer comprises a lower aluminum content than the first interlayer,
   a concentration of the p-dopant varies in a direction along a normal vector of a main extension plane of the semiconductor body within the interlayer, and has a step-shaped profile with one or more steps,
   the step-shaped profile of the concentration of the p-dopant in a direction along the normal vector of the main extension plane of the semiconductor body extends at most 50 nm into the first interlayer, and
   starting from the contact layer, the p-dopant penetrates the first interlayer at least 10 nm.

20. An optoelectronic semiconductor device comprising a semiconductor body in which an active layer configured to generate or detect electromagnetic radiation, a first interlayer and a p-conducting contact layer are formed, and a connection layer applied to the semiconductor body, wherein
   the contact layer is disposed between the first interlayer and the connection layer and adjoins the connection layer,
   the active layer is arranged on a side of the first interlayer remote from the contact layer,
   the first interlayer and the contact layer are based on a nitride compound semiconductor,
   the contact layer is doped with a p-dopant,
   the contact layer has a thickness of at most 50 nm,
   the contact layer comprises a lower aluminum content than the first interlayer, and
   a two-dimensional charge carrier gas is formed at an interface between the contact layer and the first interlayer, the distribution of which extends as far as the connection layer.

* * * * *